United States Patent
Shim

(10) Patent No.: US 6,812,144 B2
(45) Date of Patent: Nov. 2, 2004

(54) METHOD FOR FORMING METAL WIRING IN A SEMICONDUCTOR DEVICE

(75) Inventor: Kew Chan Shim, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/626,890

(22) Filed: Jul. 24, 2003

(65) Prior Publication Data

US 2004/0152300 A1 Aug. 5, 2004

(30) Foreign Application Priority Data

Dec. 11, 2002 (KR) .............................. 10-2002-0078658

(51) Int. Cl.[7] .............................................. H01L 21/44
(52) U.S. Cl. .................... 438/652; 438/653; 438/654; 438/656; 438/675; 438/680; 438/687; 438/648
(58) Field of Search ................................ 438/652, 653, 438/654, 656, 675, 680, 687, 648

(56) References Cited

U.S. PATENT DOCUMENTS

| 6,153,515 | A | * | 11/2000 | Murakami et al. .......... 438/643 |
| 6,218,734 | B1 | | 4/2001 | Charneski et al. |
| 6,297,147 | B1 | | 10/2001 | Yang et al. |
| 6,342,444 | B1 | | 1/2002 | Higashi et al. |
| 6,407,003 | B2 | * | 6/2002 | Urabe .......................... 438/720 |
| 6,423,201 | B1 | | 7/2002 | Mandrekar |
| 6,472,023 | B1 | * | 10/2002 | Wu et al. ................. 427/430.1 |
| 6,623,799 | B1 | * | 9/2003 | Lee et al. ............... 438/687 X |
| 6,720,262 | B2 | * | 4/2004 | Koh et al. ................... 438/687 |
| 2002/0064953 | A1 | * | 5/2002 | Nishikawa et al. .......... 438/689 |

FOREIGN PATENT DOCUMENTS

| JP | 11 026394 | 1/1999 |
| JP | 2002 190524 | 7/2002 |

* cited by examiner

Primary Examiner—Matthew Smith
Assistant Examiner—Victor V Yevsikov
(74) Attorney, Agent, or Firm—Ladas & Parry LLP

(57) ABSTRACT

Disclosed is a method for forming metal wiring in a semiconductor device. The method comprises forming a TiN thin layer on a semiconductor substrate by using Ti compound containing a halogen element which corresponds to a 17 group element in the periodic table and $NH_3$ reactant and adsorbing halogen atoms to the surface of the TiN thin layer; and forming a copper (Cu) thin layer on the TiN thin layer by using the adsorbed halogen atoms as catalyst. Wiring can be carried out in situ in a single chamber system in order to obtain excellent interface characteristics and a short process time.

18 Claims, 3 Drawing Sheets

METHOD FOR FORMING METAL WIRING IN A SEMICONDUCTOR DEVICE

BACKGROUND OF THE INVENTION

1. Field of the Invention

The present invention relates to a method for forming metal wiring in a semiconductor device, in particular, by which a diffusion barrier and a copper layer can be formed in situ by using several reactants.

2. Description of the Prior Art

Conventional wiring processes have been performed by forming a TiN layer as a diffusion barrier in a reaction chamber and then depositing copper (Cu) in a subsequent reaction chamber.

Where catalyst such as iodine (I) is used, Cu deposition is performed after catalytic adsorption in a catalytic adsorptive reaction chamber.

Existing wiring processes, however, produce an oxide layer such as $TiO_2$ on the TiN layer resulting in poor interface characteristics and unsatisfactory catalytic effects. There are also drawbacks that three separate reaction chambers are required, the processes are complicated, and long wiring time is required.

SUMMARY OF THE INVENTION

Accordingly, the present invention has been made to solve the above-mentioned problems occurring in the prior art, and an object of the present invention is to provide a method for forming metal wiring in a semiconductor device by which wiring can be carried out in situ in a single chamber system in order to obtain excellent interface characteristics and a short process time.

According to an aspect of the invention to accomplish this object, there is provided a method for forming metal wiring in a semiconductor device, the method comprising the following steps of: forming a TiN thin layer on a semiconductor substrate by using Ti compound containing a halogen element which corresponds to a group XVII element in the periodic table and $NH_3$ reactant and adsorbing halogen atoms to the surface of the TiN thin layer; and forming a copper (Cu) thin layer on the TiN thin layer by using the adsorbed halogen atoms as catalyst.

According to another aspect of the invention to accomplish this object, there is provided a method for forming metal wiring in a semiconductor device, the method comprising the following steps of: forming an insulation layer on a semiconductor substrate and a contact hole in the insulation layer; forming a TiN thin layer on the insulation layer including the contact hole by using Ti compound and $NH_3$ reactant and adsorbing halogen atoms to the surface of the TiN thin layer; and forming a copper (Cu) thin layer on the TiN thin layer by using the adsorbed halogen atoms as catalyst to fill the contact hole.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

The following detailed description will disclose a method for forming metal wiring in a semiconductor device of the invention in reference to the accompanying drawings.

Figure 1A:
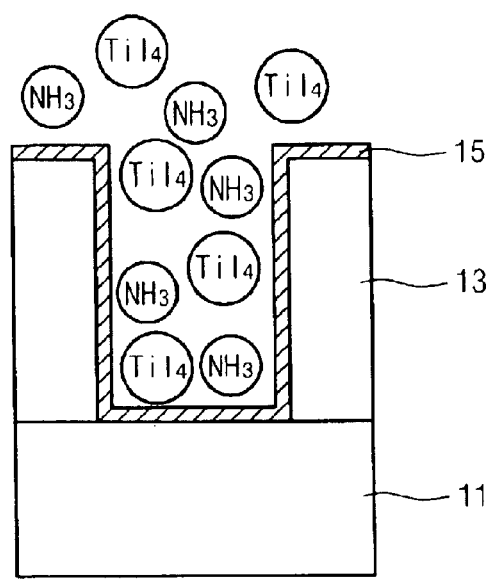
FIGS. 1A and 1B are cross-sectional views illustrating TiN layer deposition by using $TiI_4$ reactant and $NH_3$ according to a method for forming metal wiring in a semiconductor device of the invention.
Figure 1B:
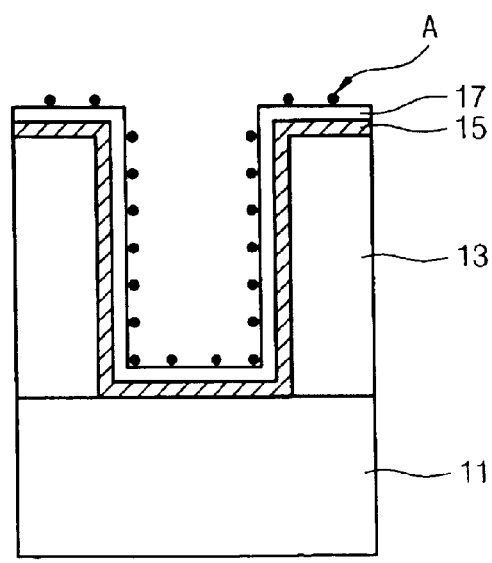

FIGS. 1A and 1B are cross-sectional views illustrating TiN layer deposition by using $TiI_4$ reactant and $NH_3$ according to a method for forming metal wiring in a semiconductor device of the invention.

The method for forming metal wiring in a semiconductor device of the invention primarily deposits an insulation layer 13 on a semiconductor substrate 11 and then selectively removes the insulation layer 13 by using a photomask (not shown) via photolithography, thereby forming a contact hole 15 (or trench) as shown in FIG. 1A.

Then, by using $TiI_4$ reactant and $NH_3$, a TiN thin layer 17 is deposited on the insulation layer 13 including the contact hole 15 as shown in FIG. 1B. Deposition is performed at a temperature of about 150 to 300° C. under a pressure of about 0.1 to 10 torr. Alternatively, iodine (I) may be replaced by a compound containing a halogen element such as fluorine (F), chlorine (Cl), bromine (Br) and astatine (At) or a group XVII element in the periodic table.

$TiI_4$ and $NH_3$ can be injected simultaneously or sequentially in the form of Atomic Layer Deposition (ALD) Further, plasma is used in formation of the TiN diffusion barrier.

When $TiI_4$ and $NH_3$ are fed in the form of gas into a reaction chamber, they are decomposed on the substrate such as a silicon layer or a silicon oxide layer to form the TiN thin layer 17, in which hydrogen iodide (HI) exits the reaction chamber and some of I atoms (A) adsorb on the surface of the TiN thin layer.

The above process will be expressed by the following reaction formula:

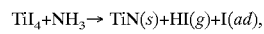

$$TiI_4 + NH_3 \rightarrow TiN(s) + HI(g) + I(ad),$$

wherein $TiI_4$ and $NH_3$ can be injected simultaneously or sequentially in the form of ALD to form the TiN thin layer.

FIGS. 2A through 2D are cross-sectional views illustrating copper (Cu) CVD by using catalyst according to the method for forming metal wiring in a semiconductor device of the invention.

When a Cu thin layer is deposited on the TiN thin layer 17 to which the I atoms are adsorbed, it can be observed that the inside of a pattern is filled in a form of bottom-up fill, instead of conformal deposition which is observed in conventional CVD processes.

Figure 2A:
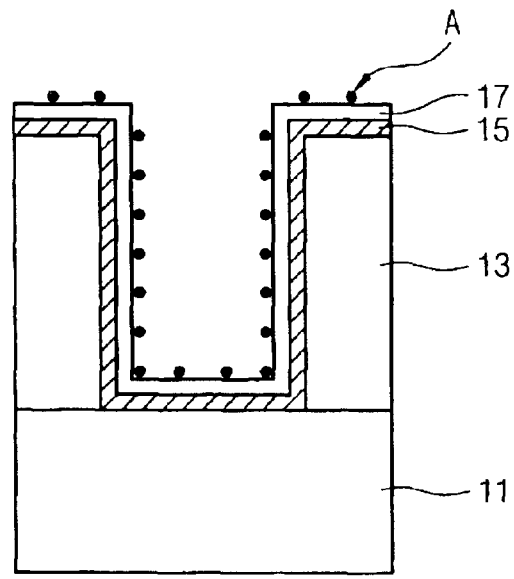
FIGS. 2A through 2D are cross-sectional views illustrating copper CVD by using catalyst according to the method for forming metal wiring in a semiconductor device of the invention.

As shown in FIG. 2A, as soon as the TinN thin layer 17 is deposited on the substrate, the I atoms (A) are absorbed on the surface of the TiN thin layer 17.

Figure 2B:
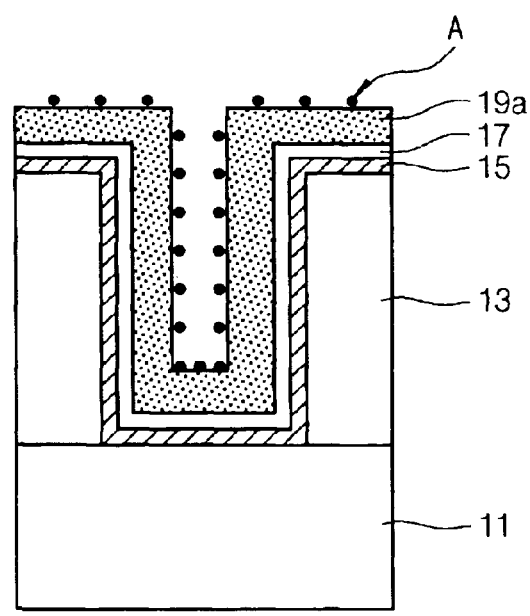

After deposition of the TiN thin layer 17, a Cu thin layer 19*a* is deposited on the TiN thin layer 17 by using hexafluoroacethyl-acetonate Cu vinyltrimethyl-silane reactant as shown in FIG. 2B. As for the Cu precursor in the Cu thin layer 19*a*, hexafluoroacethyl-acetonate Cu vinyltrimethyl-silane reactant may be alternatively replaced by any of Cu(hfac)2, (hfac)Cu(COD), and (hfac) (Cu) (ATMS), in which ATMS is an abbreviation of allyltrimethylsilane.

The Cu thin layer is deposited at a temperature of about 150 to 300° C. under a pressure of 0.1 to 10 torr. As shown in FIG. 2B, the Cu thin layer 19a in an initial deposition step is uniformly deposited on both the bottom and the wall of the pattern at a uniform deposition rate per time as can be observed in general CVD processes.

Alternatively, the Cu thin layer may be replaced by any of tungsten (W), aluminum (Al) and tantalum (Ta) thin layers.

Figure 2C:
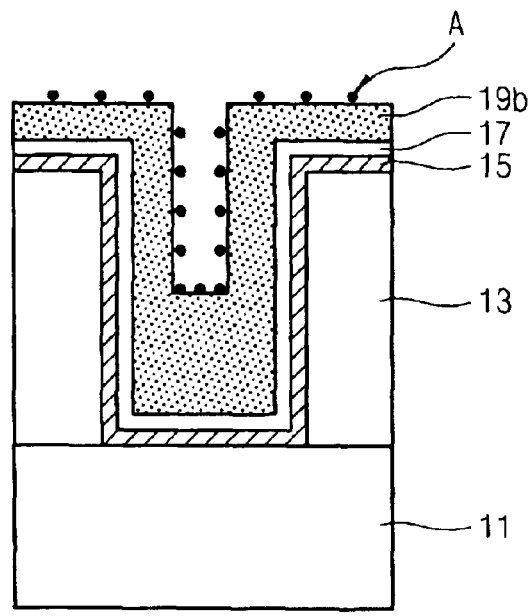

As shown in FIG. 2C, the Cu thin layer 19a grows at a more rapid rate in the bottom of the pattern than that in any other portions thereof in an intermediate step of Cu deposition. The deposition rate of the Cu thin layer 19b is gradually accelerated according to deposition time so that the pattern is rapidly filled.

Figure 2D:
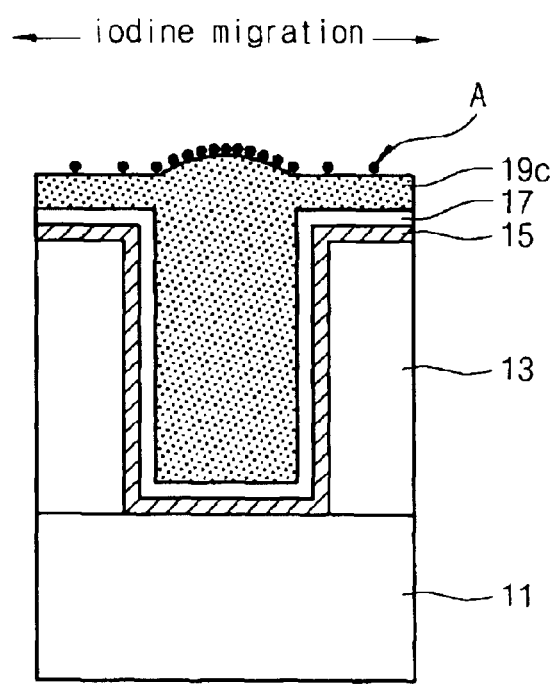

Then, the pattern is completely filled in a final step of Cu deposition, as shown in FIG. 2D, in which the growth rate of the thin layer sharply drops down and thus becomes substantially equal to that in the initial step of Cu deposition. As a result, the pattern is completely bottom-up filled thereby leaving traces in the form of a mound in a place where the hole or trench existed.

In the initial deposition step, the Cu thin layer is uniformly deposited on the surface of the pattern so that the surface area of the bottom and wall of the contact hole gradually decreases as the thin layer grows. However, because a fixed quantity of I is adsorbed on the Cu thin layer, the density of I increases as the surface area decreases.

The decrement of the surface area of the bottom and wall of the contact hole 15 is determined based upon the geometry of the contact hole 15.

Therefore, the decrement of the surface of the bottom is larger than that of the wall so that the density of I in the bottom of the contact hole increases more rapid than that of the wall.

Because the density of I also increases according to continued growth of the Cu thin layer, the growth rate of the thin layer outside the contact hole is also gradually accelerated thereby reaching the critical growth rate, which corresponds to a time point where conformal deposition converts to bottom-up filling.

Herein, the critical growth rate is defined as a growth rate where the growth rate of the thin layer exceeds the diffusion rate based upon density variation. In the intermediate deposition step in FIG. 2C, the growth rate of the thin layer at the bottom is faster than that of the diffusion rate of I in the wall of the contact hole so that I (A), which was absorbed to the wall, is collected on the surface of the Cu thin layer 19b which grows upward from the bottom of the contact hole.

As the Cu thin layer 19C continues to grow, the quantity of I collected on the surface of the Cu thin layer 19C also continues to increase, as shown in FIG. 2D, thereby further increasing the growth rate of the thin layer.

When the inside of the pattern is almost bottom-up filled as above, the rate of the Cu thin layer growing from the bottom has the maximum value.

As the inside is completely filled and the pattern becomes flat, the stage II in FIG. 2C is converted into the stage III in FIG. 2D. While I is partially concentrated on the surface of the Cu thin layer at the bottom in the previous stage II (refer to FIG. 2C), I rapidly diffuses in the stage III into surrounding portions of the Cu thin layer thereby decreasing the density of I at the bottom.

The growth rate of the thin layer surface in the pattern becomes equal to other portions of the thin layer surface as time lapses. At the same time, concentrated I diffuses into the surface of the surrounding thin layer portions, in which I is uniformly re-distributed.

As described above, the method for forming metal in a semiconductor device uses $TiI_4$ and $NH_3$ as reactant to form the TiN diffusion barrier so that a single chamber system can execute the role of the existing three chamber systems (that is, reaction chambers for diffusion barrier formation, catalytic reaction and Cu thin layer formation), and utilizes adsorbed I atoms produced during reaction as catalyst. At the same time, hexafluoroacethyl-acetonate Cu vinyltrimethylsilane reactant is used in situ in order to deposit the Cu thin layer.

As a result, formation of metal wiring is carried out in one chamber system in order to obtain excellent interface characteristics and a short process time.

Furthermore, there is an advantage that a void-free Cu thin layer can be deposited directly on the TiN diffusion barrier without a Cu seed layer.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for forming metal wiring in a semiconductor device, the method comprising the steps of:
   forming a TiN thin layer on a semiconductor substrate by using Ti compound containing a halogen element and $NH_3$ reactant and adsorbing halogen atoms to the surface of the TiN thin layer; and
   forming a metal layer on the TiN thin layer by using the adsorbed halogen atoms as catalyst.

2. The method for forming metal wiring in a semiconductor device as set forth in claim 1, wherein the metal layer is made from Copper.

3. The method for forming metal wiring in a semiconductor device as set forth in claim 2, wherein the metal layer is formed in situ after formation of the TiN thin layer by selectively using one of a group including hexafluoroacethyl-acetonate Cu vinyltrimethyl-silane reactant, Cu(hfac)2, (hfac)Cu(COD) and (hfac)(Cu)(ATMS).

4. The method for forming metal wiring in a semiconductor device as set forth in claim 2, wherein the copper layer is deposited via Chemical Vapor Deposition (CVD).

5. The method for forming metal wiring in a semiconductor device as set forth in claim 2, wherein the TiN thin layer and the Cu layer are formed at a temperature of about 100 to 300° C. under a pressure of about 0.1 to 10 torr.

6. The method for forming metal wiring in a semiconductor device as set forth in claim 2, wherein the TiN thin layer and the Cu layer are deposited in a single chamber.

7. The method for forming metal wiring in a semiconductor device as set forth in claim 1, wherein the step of forming a thin layer is applied to a contact hole pattern or a trench pattern.

8. The method for forming metal wiring in a semiconductor device as set forth in claim 1, wherein the metal layer is made from at least one consisting of tungsten, aluminum, and tantalum.

9. The method for forming metal wiring in a semiconductor device as set forth in claim 1, wherein the halogen element includes iodine (I), fluorine (F), chlorine (Cl), bromine (Br) and astatine (At) of group XVII elements in the periodic table.

10. The method for forming metal wiring in a semiconductor device as set forth in claim 1, wherein the Ti compound and the $NH_3$ reactant are injected simultaneously or sequentially in the form of Atomic Layer Deposition (ALD).

11. The method for forming metal wiring in a semiconductor device as set forth in claim 1, wherein the TiN thin layer is formed using plasma.

12. The method for forming metal wiring in a semiconductor device as set forth in claim 1, wherein the Ti compound includes TiI$_4$, wherein the adsorbed halogen element is I.

13. A method for forming metal wiring in a semiconductor device, the method comprising the steps of:

forming an insulation layer on a semiconductor substrate and a contact hole in the insulation layer;

forming a TiN thin layer on the insulation layer including the contact hole by using Ti compound and NH$_3$ reactant and adsorbing halogen atoms to the surface of the TiN thin layer; and forming a copper layer on the TiN thin layer by using the adsorbed halogen atoms as catalyst to fill the contact hole.

14. The method for forming metal wiring in a semiconductor device as set forth in claim 13, wherein the copper layer is formed in situ after formation of the TiN thin layer by selectively using one of a group including hexafluoroacethyl-acetonate Cu vinyltrimethyl-silane reactant, Cu(hfac)2, (hfac)Cu(COD) and (hfac)(Cu) (ATMS).

15. The method for forming metal wiring in a semiconductor device as set forth in claim 13, wherein the halogen element includes iodine (I), fluorine (F), chlorine (Cl), bromine (Br) and astatine (At) of group XVII elements in the periodic table.

16. The method for forming metal wiring in a semiconductor device as set forth in claim 13, wherein the TiN thin layer and the Cu layer are formed at a temperature of about 100 to 300° C. under a pressure of about 0.1 to 10 torr.

17. The method for forming metal wiring in a semiconductor device as set forth in claim 13, wherein the Ti compound and the NH$_3$ reactant are injected simultaneously or sequentially in the form of Atomic Layer Deposition (ALD).

18. The method for forming metal wiring in a semiconductor device as set forth in claim 13, wherein the Ti compound includes TiI$_4$, wherein the adsorbed halogen element is I.

* * * * *